United States Patent
Chu et al.

(10) Patent No.: US 11,935,581 B2
(45) Date of Patent: Mar. 19, 2024

(54) CIRCUIT MODULE WITH RELIABLE MARGIN CONFIGURATION

(71) Applicant: M31 TECHNOLOGY CORPORATION, Hsinchu County (TW)

(72) Inventors: Li-Wei Chu, Hsinchu County (TW); Nan-Chun Lien, Hsinchu County (TW)

(73) Assignee: M31 TECHNOLOGY CORPORATION, Hsinchu County (TW)

( * ) Notice: Subject to any disclaimer, the term of this patent is extended or adjusted under 35 U.S.C. 154(b) by 121 days.

(21) Appl. No.: 17/828,071

(22) Filed: May 31, 2022

(65) Prior Publication Data

US 2022/0399052 A1 Dec. 15, 2022

(30) Foreign Application Priority Data

Jun. 11, 2021 (TW) .................................. 110121546

(51) Int. Cl.
| | |
|---|---|
| *G11C 11/34* | (2006.01) |
| *G11C 11/4074* | (2006.01) |
| *G11C 11/4076* | (2006.01) |
| *G11C 11/408* | (2006.01) |
| *G11C 11/4091* | (2006.01) |
| *G11C 11/4096* | (2006.01) |

(52) U.S. Cl.
CPC ...... *G11C 11/4091* (2013.01); *G11C 11/4074* (2013.01); *G11C 11/4076* (2013.01); *G11C 11/4085* (2013.01); *G11C 11/4096* (2013.01)

(58) Field of Classification Search
CPC ............ G11C 11/4091; G11C 11/4074; G11C 11/4076; G11C 11/4085; G11C 11/4096
USPC ...................................................... 365/185.21
See application file for complete search history.

(56) References Cited

U.S. PATENT DOCUMENTS

| | | | | |
|---|---|---|---|---|
| 6,118,746 | A | * | 9/2000 | Verboom ......... G11B 20/10037 |
| 8,447,547 | B2 | * | 5/2013 | Jung ...................... G11C 29/50 |
| | | | | 702/179 |
| 9,076,557 | B2 | * | 7/2015 | Grant ................. G11C 16/0433 |
| 11,621,038 | B2 | * | 4/2023 | Kang .................. G11C 11/4096 |
| | | | | 365/206 |

FOREIGN PATENT DOCUMENTS

| | | | | |
|---|---|---|---|---|
| JP | 2004005777 A | * | 1/2004 | ........... G11C 11/412 |
| JP | 2013069372 A | * | 4/2013 | ........... G11C 11/419 |
| WO | WO-2015147587 A1 | * | 10/2015 | ........... G11C 11/419 |

* cited by examiner

*Primary Examiner* — Viet Q Nguyen
(74) *Attorney, Agent, or Firm* — WPAT, P.C

(57) ABSTRACT

A circuit module with reliable margin configuration, may include a main circuit, a first auxiliary circuit and a second auxiliary circuit. When the first auxiliary circuit is on, the second auxiliary circuit may be on or off according to whether a control signal is of a first level or a second level. When the first auxiliary circuit and the second auxiliary circuit are both on, the first auxiliary circuit and the second auxiliary circuit may jointly cause an operation parameter of the main circuit to be a first value. When the first auxiliary circuit is on and the second auxiliary circuit is off, the first auxiliary circuit may cause the operation parameter to be a second value. An operation margin of the main circuit may cover a range between the first value and the second value.

20 Claims, 8 Drawing Sheets

US 11,935,581 B2

CIRCUIT MODULE WITH RELIABLE MARGIN CONFIGURATION

This application claims the benefit of Taiwan application Serial No. 110121546, filed Jun. 11, 2021, the subject matter of which is incorporated herein by reference.

FIELD OF THE INVENTION

The present invention relates to a circuit module with reliable margin configuration, more particularly, to a circuit module, e.g., a memory module, which may include a main circuit, a first auxiliary circuit and a second auxiliary circuit, wherein: when the first auxiliary circuit is on, the second auxiliary circuit may be on or off according to a control signal, and an operation parameter of the main circuit may therefore be a first value or a second value; also, an operation margin of the main circuit may cover a range between the first value and the second value, such that the main circuit may not need to interrupt or stop an on-going operation when switching between different operation conditions.

BACKGROUND OF THE INVENTION

Various kinds of circuit modules, such as silicon intellectual properties or memory modules, are essential building blocks of integrated circuits. To balance power consumption and performance, modern circuit modules switch to operate under different modes, such as a high-performance mode of high clock rate and high supply voltage, and a low-power mode of low clock rate and low supply voltage. Under different modes, each of various operation parameters of a circuit module changes to different values. For example, under different clock rates of different modes, each of some access timing parameters of a memory module will be of different values; under different supply voltages of different modes, each of some voltage parameters applied to bit line(s) and/or word line(s) of a memory module will be of different values.

To support different modes, in a prior art, a conventional circuit module includes different mode-specific circuits, such as a first mode-specific circuit specifically for a first mode, and a second mode-specific circuit specifically for a second mode. When the conventional circuit module operates in the first mode, the first mode-specific circuit is on, and the second mode-specific circuit is off; when the conventional circuit module operates in the second mode, the first mode-specific circuit is off and the second mode-specific circuit is on. In such prior art, the first mode-specific circuit causes an operation parameter of the conventional circuit module to be a first value, and the second mode-specific circuit causes said operation parameter to a different second value, such that the operation parameter will be the first value under the first mode (since only the first one of the two mode-specific circuits is on), and the operation parameter will be the second value under the second mode (since only the second one of the two mode-specific circuits is on).

However, the prior art suffers disadvantages. For example, completely switching from the first mode to the second mode (or completely switching from the second mode to the first mode) will need a mode-switching interval. During the mode-switching interval, whether the first mode-specific circuit and the second mode-specific circuit are on or off is of random nature, and is therefore uncertain; ideally, one of the two mode-specific circuits turns on and the other one turns off concurrently, but it is also possible that, at least during a portion of the mode-switching interval, the two mode-specific circuit are both on or are both off, or the one supposed to turn on does not turn on and the one supposed to turn off does not turn off, etc. Due to the uncertainty during the mode-switching interval, value of the operation parameter of the conventional circuit module will also be uncertain. For example, if the first and second mode-specific circuits are both on, then it is difficult to determine whether the operation parameter is the first value, the second value or another different value.

Furthermore, each mode-specific circuit needs a transient time to completely turn on from off or to completely turn off from on. During the mode-switching interval, even if the two mode-specific circuits correctly turn on from off and turn off from on, the on-off transient times of the two mode-specific circuits will cause unexpected impact to operation of the conventional circuit module. For example, when the conventional circuit module switches from the first mode to the second mode, the operation parameter is expected to change to the second value; however, if the first mode-specific circuit does not completely turn off when the second mode-specific circuit is on, the operation parameter will deviate from the first value and the second value.

To avoid uncertainty of mode-switching and on-off transient, the prior art will stop normal operation of the circuit module when switching between modes, and resume normal operation after mode-switching is completed. For example, a conventional memory module will switch modes after an access (read or write) cycle ends, stop any access operation during the mode-switching interval, and proceed to a next access cycle after different mode-specific circuits correctly and completely turn between on and off. Because normal operation needs to be stopped during mode-switching, the prior art lowers operation efficiency of circuit module.

SUMMARY OF THE INVENTION

An object of the invention is providing a circuit module (e.g., 100 in FIG. 1) with reliable margin configuration such that the circuit module may not need to interrupt, stop and/or suspend a currently on-going operation when switching between different operation conditions. The circuit module may include a main circuit (e.g., 110 in FIG. 1), a first auxiliary circuit (e.g., 121, y1[$p$] or x1[$k$] in FIG. 3a, 4a or 5a) and a second auxiliary circuit (e.g., 122, y2[$p$] or x2[$k$] in FIG. 3a, 4a or 5a). The main circuit may include a first node (e.g., n1, a1[$p$] or b1[$k$] in FIG. 3a, 4a or 5a). The first auxiliary circuit may be coupled to the first node, and the second auxiliary circuit may be coupled to the first node and a control signal (e.g., dvs_sa_relax in FIG. 3a or dvs_rawa_assert in FIG. 4a or 5a). When the first auxiliary circuit is on, the second auxiliary circuit may be on or off according to whether the control signal is of a first level or a second level (e.g., v0/v1 in FIG. 2). When the first auxiliary circuit and the second auxiliary circuit are both on, the first auxiliary circuit and the second auxiliary circuit may jointly cause an operation parameter of the main circuit to be a first value (e.g., T31, T42 or v52 in FIG. 3b, 4b or 5b). When the first auxiliary circuit is on and the second auxiliary circuit is off, the first auxiliary circuit may cause said operation parameter to be a second value (e.g., T32, T41 or v51 in FIG. 3b, 4b or 5b) different from the first value. An operation margin of the main circuit may cover a range between the first value and the second value, such that: even if the control signal switches between the first level and the second level during an operation cycle (e.g., Tp1, Tp2 or Tp3 in FIG. 3b, 4b or 5b), the main circuit may continue normal operation of the operation cycle without adversely affecting operation correctness of said operation cycle.

In an embodiment (e.g., FIG. 2), when a supply voltage (e.g., VDD) of the main circuit is a first supply value (e.g., vdd1) and a period of a clock (e.g., CK) on which the main circuit operates is a first period value (e.g., T1), the control signal may be of the first level (e.g., v0); when the supply voltage of the main circuit is a second supply value (e.g., vdd2) and the period of said clock is a second period value (e.g., T2), the control signal may be of the second value (e.g., v1), wherein the first supply value and the second supply value may be different, and the first period value and the second period value may be different.

In an embodiment (e.g., FIG. 1), the main circuit may include at least one memory cell (e.g., c[p,q] in FIG. 1), at least one tracking cell (e.g., Tc[p] in FIG. 1) and at least one sensing amplifier (e.g., SA[k] in FIG. 1). The memory cell may be coupled to a word line (e.g., WL[p]) and a bit line (e.g., BL[q]). The tracking cell may be coupled to a tracking word line (e.g., TWL) and a tracking bit line (e.g., TBL). The sensing amplifier may be coupled to the bit line.

In an embodiment (e.g., FIGS. 1, 3a and 3b) of the invention, the first node (e.g., n1) may be coupled to the tracking bit line. The first auxiliary circuit (e.g., 121 in FIG. 3a) may include a first transistor (e.g., M1) and a third transistor (e.g., M3). The first transistor may include a first controlled terminal (e.g., gate terminal) and two first channel terminals (e.g., drain and source terminals); the two first channel terminals may be coupled to the first node and a third node (e.g., n3) respectively. The third transistor may include a third controlled terminal and two third channel terminals; the two third channel terminals may be coupled to the third node and a fourth node (e.g., n4) respectively, one of the first controlled terminal and the third controlled terminal may be coupled to the tracking word line. The second auxiliary circuit (e.g., 122 in FIG. 3a) may include a second transistor (e.g., M2), a fourth transistor (e.g., M4) and an inverter (e.g., 124). The second transistor may include a second controlled terminal and two second channel terminals; the two second channel terminals may be coupled to the first node and a second node (e.g., n2) respectively. The fourth transistor may include a fourth controlled terminal and two fourth channel terminals; the two fourth channel terminals may be coupled to the second node and the fourth node respectively, one of the second controlled terminal and the fourth controlled terminal may be (via the inverter) coupled to the control signal (e.g., dvs_sa_relax), and the other one of the second controlled terminal and the fourth controlled terminal may be coupled to the tracking word line. In an embodiment, said operation parameter is time for a voltage of the tracking bit line to change to a second voltage value (e.g., v32 in FIG. 3b) after the tracking word line is driven (e.g., t30 in FIG. 3b). In an embodiment, said operation parameter is time for the voltage of the tracking bit line to change from a first voltage value (e.g., v31 in FIG. 3b) to a second voltage value (e.g., v32). In an embodiment, said operation margin is a timing margin of the sensing amplifier.

In an embodiment (e.g., FIGS. 1, 4a and 4b) of the invention, the first node (e.g., a1[p] in FIG. 4a) may be coupled to the word line (e.g., WL[p] in FIG. 4a), the first auxiliary circuit (e.g., y1[p]) may include a first transistor (e.g., H1[p]) and a third transistor (e.g., H3[p]), and the second auxiliary circuit (e.g., y2[p]) may include a second transistor (e.g., H2[p]) and an inverter (e.g., INV[p]). The first transistor may include two first channel terminals coupled to the first node and a second node (e.g., a2[p]) respectively. The third transistor may include two third channel terminals coupled to the second node and a third node (e.g., a3[p]). The second transistor may include a second controlled terminal and two second channel terminals; the second controlled terminal may be coupled to the control signal (e.g., dvs_rawa_assert) via the inverter, and the two second channel terminals may be coupled to the first node and the second node respectively. In an embodiment, said operation parameter may be time for a voltage of the bit line to change from a third voltage value (e.g., v41 in FIG. 4b) to a fourth voltage value (e.g., v42). In an embodiment, said operation parameter may be time for the voltage of the bit line to change to a fourth voltage value (e.g., v42) after the word line is driven. In an embodiment (e.g., FIG. 4b), after the word line is driven, if the control signal is of the first level (e.g., v0 in FIG. 2), a voltage of the word line may be a fifth voltage value (e.g., vw42 in FIG. 4b); if the control signal is of the second level (e.g., v1 in FIG. 2), the voltage of the word line may be a sixth voltage value (e.g., vw41 in FIG. 4b) different from the fifth voltage value. In an embodiment, said operation margin may be a timing margin of the sensing amplifier.

In an embodiment (e.g., FIGS. 1, 5a and 5b) of the invention, the main circuit may further include a write circuit (e.g., WB[k] in FIGS. 1 and 5a) coupled between the bit line and a negative voltage bit line (e.g., NBL[k] in FIG. 5), and the first node (e.g., b1[k] in FIG. 5a) may be coupled to the negative voltage bit line. The first auxiliary circuit (e.g., x1[k] in FIG. 5a) may include a first logic gate (e.g., g1[k]) and a first capacitor (e.g., C1[k]). The first logic gate may include a first input terminal (e.g., i1[k]) and a first output terminal (e.g., o1[k]), and the first capacitor may be coupled between the first output terminal and the first node. The second auxiliary circuit (e.g., x2[k] in FIG. 5a) may include a second logic gate (e.g., g2[k]) and a second capacitor (e.g., C2[k]). The second logic gate may include two second input terminals (e.g., i21[k] and i22[k]) and a second output terminal (e.g., o2[k]); the two second input terminals may be coupled to the first input terminal and the control signal (e.g., dvs_rawa_assert) respectively. The second capacitor may be coupled between the second output terminal and the first node. In an embodiment, the first logic gate may be an inverter, and the second logic gate may be a NAND gate. In an embodiment, said operation parameter may be a voltage extremum of the negative voltage bit line after the word line is driven. In an embodiment, said operation margin may be a negative voltage margin of the bit line.

In an embodiment of the invention, the circuit module not only may include the first auxiliary circuit (e.g., 121 in FIG. 3a) and the second auxiliary circuit (e.g., 122 in FIG. 3a) coupled to the control signal (e.g., dvs_sa_relax), but also may include a third auxiliary circuit and a fourth auxiliary circuit (e.g., y1[p] and y2[p] in FIG. 4a, or x1[k] and x2[k] in FIG. 5a). The third auxiliary circuit may be coupled to a fourth node (e.g., a1[p] or b1[k] in FIG. 4a or 5a), and the fourth auxiliary circuit may be coupled to the fourth node and a second control signal (e.g., dvs_rawa_assert). When the third auxiliary circuit is on, the fourth auxiliary circuit may be on or off according to whether the second control signal is of a third level or a fourth level (e.g., v0/v1 in FIG. 2). When the third auxiliary circuit and the fourth auxiliary circuit are both on, the third auxiliary circuit and the fourth auxiliary circuit may jointly cause a second operation parameter of the main circuit to be a third value (e.g., T42 or v52 in FIG. 4b or 5b). When the third auxiliary circuit is on and the fourth auxiliary circuit is off, the third auxiliary circuit may cause said second operation parameter to be a fourth value (e.g., T41 or v51 in FIG. 4b or 5b) different from the third value. A second operation margin of the main circuit may cover a range between the third value and the fourth value. The control signal and the second control signal may not concurrently switch between different levels. In an embodiment, when the control signal switches (e.g., t1-t2 in FIG. 2) between different levels, the second control signal may switch (e.g., t3-t4) between different levels after a first delay time (e.g., Dt1). When the second control signal switches (e.g., t5-t6) between different levels again, the control signal may switch (e.g., t7-t8) between different levels again after a second delay time (e.g., Dt2).

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIGS. 3b, 4b and 5b respectively illustrate timing and waveform embodiments of related signals shown in FIGS. 3a, 4a and 5a.

DETAILED DESCRIPTION OF PREFERRED EMBODIMENTS

Figure 1:
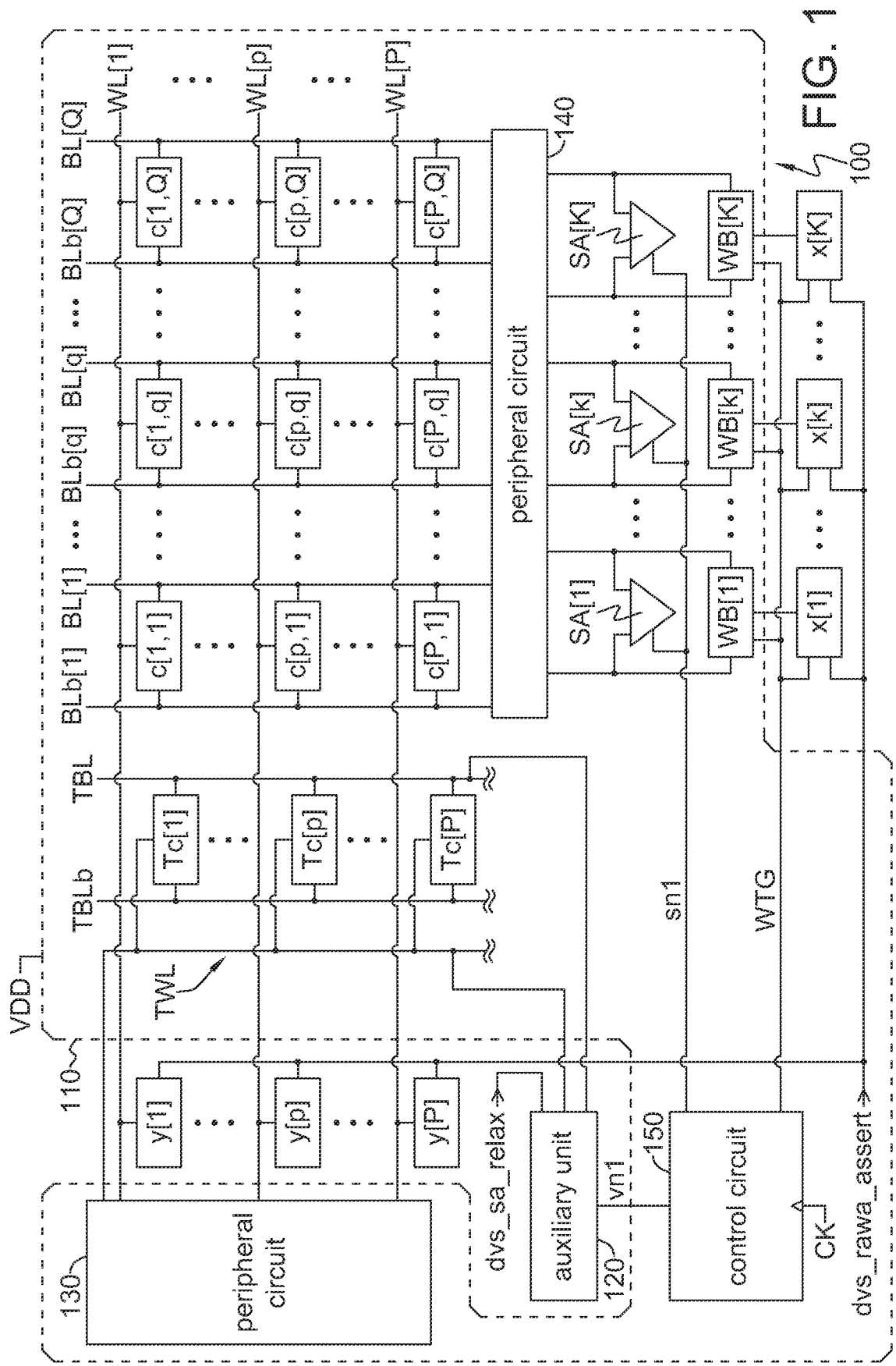
FIG. 1 illustrates a circuit module according to an embodiment of the invention, wherein the circuit module may include three kinds of auxiliary units.

FIG. 1 illustrates a circuit module 100 according to an embodiment of the invention, the circuit module 100 may include a main circuit 110; to implement the invention, the circuit module 100 may further include auxiliary units 120, y[1] to y[P] and x[1] to x[K]. As shown in FIG. 1, in an embodiment of the invention, the circuit module 100 may be a memory module, such as an embedded static random access memory module; the main circuit 110 may be a memory array, and may include a number P*Q of memory cells c[1,1] to c[P,Q], a number P of word lines WL[1] to WL[P], a number Q of sets of bit lines such as BL[1] to BL[Q] and BLb[1] to BLb[Q], a number P of tracking cells Tc[1] to Tc[P], a tracking word line TWL, a set of tracking bit lines such as TBL and TBLb, a number K of write circuits WB[1] to WB[K], a number K of sensing amplifiers SA[1] to SA[K], two peripheral circuits 130 and 140, and a control circuit 150. Each of the numbers P, Q and K may be an integer greater than 1. With support of the auxiliary units 120, y[1] to y[P] and x[1] to x[K], the control circuit 150 may control operation of the main circuit 110. Because of the auxiliary units 120, y[1] to y[P] and x[1] to x[K] of the invention, the main circuit 110 may not need to stop currently on-going operation when switching between different operation conditions (or different modes, such as different values of supply voltage and/or different values of clock rate); even if operation condition switches during an operation cycle (e.g., a read cycle or a write cycle), the main circuit 110 may continue normal operation (e.g., read or write) of said operation cycle without affecting operation correctness of said operation cycle. The invention will be further described later.

In the main circuit 110, each memory cell c[p,q] (for p=1 to P and q=1 to Q) may be a static random access memory cell, and may be coupled to a corresponding word line WL[p] and one or more corresponding bit lines, such as BL[q] and BLb[q]. Each memory cell c[p,q] may store data of one bit. Each tracking cell Tc[p] may be coupled to the tracking word line TWL and one or more tracking bit lines such as TBL and TBLb. Each tracking cell Tc[p] (for p=1 to P) may have a same circuitry structure as each memory cell c[p,q], and may therefore reflect response of each memory cell c[p,q]. The peripheral circuit 130 may be coupled to the word lines WL[1] to WL[P], and the peripheral circuit 140 may be coupled to the bit lines BL[1] to BL[Q] and BLb[1] to BLb[Q], the sensing amplifiers SA[1] to SA[K] and the write circuits WB[1] to WB[K]. The control circuit 150 may provide a signal sn1 to the sensing amplifiers SA[1] to SA[K], and may provide a signal WTG to the write circuits WB[1] to WB[K]. A supply voltage VDD may supply power required for operations of the main circuit 110; for example, each memory cell c[p,q] may drain power of the supply voltage VDD to latch its bit data. The control circuit 150 may control operation cycles (e.g., access cycles including read cycles and write cycles) according to a clock CK.

As shown in FIG. 1, the auxiliary unit 120 may be coupled to a control signal dvs_sa_relax, the tracking word line TWL, the tracking bit line TBL and the control circuit 150. Each auxiliary unit y[p] (for p=1 to P) may be coupled to a corresponding word line WL[p] and a control signal dvs_rawa_assert. Each auxiliary unit x[k] (for k=1 to K) may be coupled to the signal WTG, the control signal dvs_rawa_assert and a corresponding write circuit WB[k].

When reading data from the memory cell c[p,q], the peripheral circuit 130 may drive the word line WL[p], the peripheral circuit 140 may relay the bit lines BL[q] and BLb[q] to one of the sensing amplifiers SA[1] to SA[K] such as the sensing amplifier SA[k], so the sensing amplifier SA[k] may read the data stored in the memory cell c[p,q] under timing control of the signal sn1. During data reading, the auxiliary unit 120 may provide a signal vn1 according to the signal dvs_sa_relax, and timing of the signal sn1 may relate to the signal vn1 (detailed later). When the peripheral circuit 130 drives the word line WL[p], the auxiliary unit y[p] may adjust value of driving voltage according to the signal dvs_rawa_assert (detailed later).

When writing data to the memory cell c[p,q], the peripheral circuit 130 may drive the word line WL[p], the peripheral circuit 140 may relay the bit lines BL[q] and BLb[q] to one of the write circuits WB[1] to WB[K] such as the write circuit WB[k], so the write circuit WB[k] may write data to the memory cell c[p,q] under triggering of the signal WTG. When the signal WTG triggers, the corresponding auxiliary unit x[k] may cause a negative voltage on the bit lines BL[q] and BLb[q] via the write circuit WB[k], may adjust amount of the negative voltage (detailed later), and may therefore assist the write circuit WB[k] to write data to the memory cell c[p,q].

Figure 2:
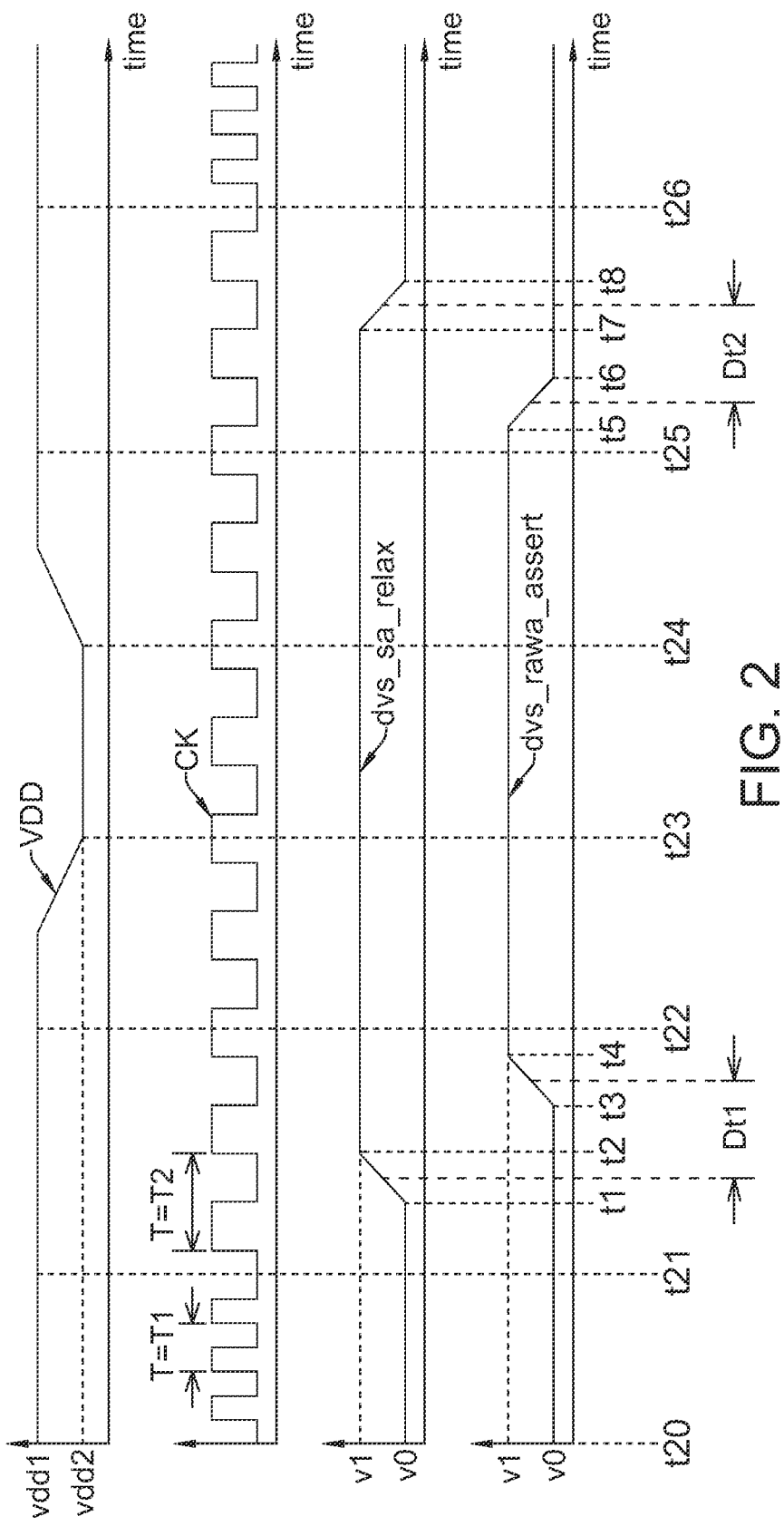
FIG. 2 illustrates timing and waveform embodiment of related signals shown in FIG. 1.

The signals dvs_sa_relax and dvs_rawa_assert may relate to operation condition of the circuit module 100, including the supply voltage VDD and the clock CK. Following FIG. 1, FIG. 2 illustrates switching of the supply voltage VDD and the clock CK, and timing of the signals dvs_sa_relax and dvs_rawa_assert in the circuit module 100. As shown in FIG. 2, between time points t20 to t21, value of the supply voltage VDD may be a supply value vdd1, value of a period T of the clock CK may be a period value T1, and signal level of the signals dvs_sa_relax and dvs_rawa_assert may be a level v0.

Between time points t21 and t22, the supply voltage VDD may keep being the supply value vdd1, but the period T may switch to a period value T2, wherein the period values T1 and T2 may be different. For example, the period value T1 may be less (shorter) than the period value T2; that is, the clock CK may switch from a higher clock rate (1/T1) to a slower clock rate (1/T2) after the time point t21. Moreover, during the time points t21 and t22, the signal dvs_sa_relax may switch from the level v0 to a different level v1 between time points t1 and t2; after a delay time Dt1, the signal dvs_rawa_assert may switch from the level v0 to the level v1 between time points t3 and t4.

Between time points t22 and t23, the period T of the clock CK may remain to be the period value T2, the signals dvs_sa_relax and dvs_rawa_assert may keep at the level v1, and the supply voltage VDD may switch from the supply value vdd1 to a different supply value vdd2; for example, the supply value vdd2 may be lower than the supply value vdd1.

Between time points t23 and t24, the supply voltage VDD may remain to be the supply value vdd2, the period T of the clock CK may remain to be the period value T2, the signals dvs_sa_relax and dvs_rawa_assert may remain to be of the level v1. Before the time point t21, the operation condition of the circuit module 100 is the supply value vdd1 and the period value T1 (e.g., a high-performance mode); by switching preparation during the time points t21 to t23, the operation condition of the circuit module 100 may switch to the supply value vdd2 and the period value T2 (e.g., a low-power mode) after the time point t23.

Between time points t24 and t25, the period T of the clock CK may remain to be the period value T2, the signals dvs_sa_relax and dvs_rawa_assert may keep at the level v1, and the supply voltage VDD may switch back to the supply value vdd1 from the supply value vdd2.

Between time points t25 and t26, the supply voltage VDD may remain to be the supply value vdd1, the period T may remain to be the period value T2. Moreover, during the time points t25 and t26, the signal dvs_rawa_assert may switch from the level v1 to the level v0 between time points t5 and t6; after a delay time Dt2, the signal dvs_sa_relax may switch from the level v1 to the level v0 between time points t7 and t8.

After the time point t26, the supply voltage VDD may remain to be the supply value vdd1, the signals dvs_sa_relax and dvs_rawa_assert may keep at the level v0, and the period T may switch back to the period value T1. During the time points t23 and t24, the operation condition of the circuit module 100 is the supply value vdd2 and the period value T2; by switching preparation during the time points t24 to t26, the operation condition of the circuit module 100 may switch back to the supply value vdd1 and the period value T1 after the time point t26. From FIG. 2, it is understood that level switching of the signals dvs_sa_relax and dvs_rawa_assert may relate to operation-condition switching of the circuit module 100.

Figure 3A:
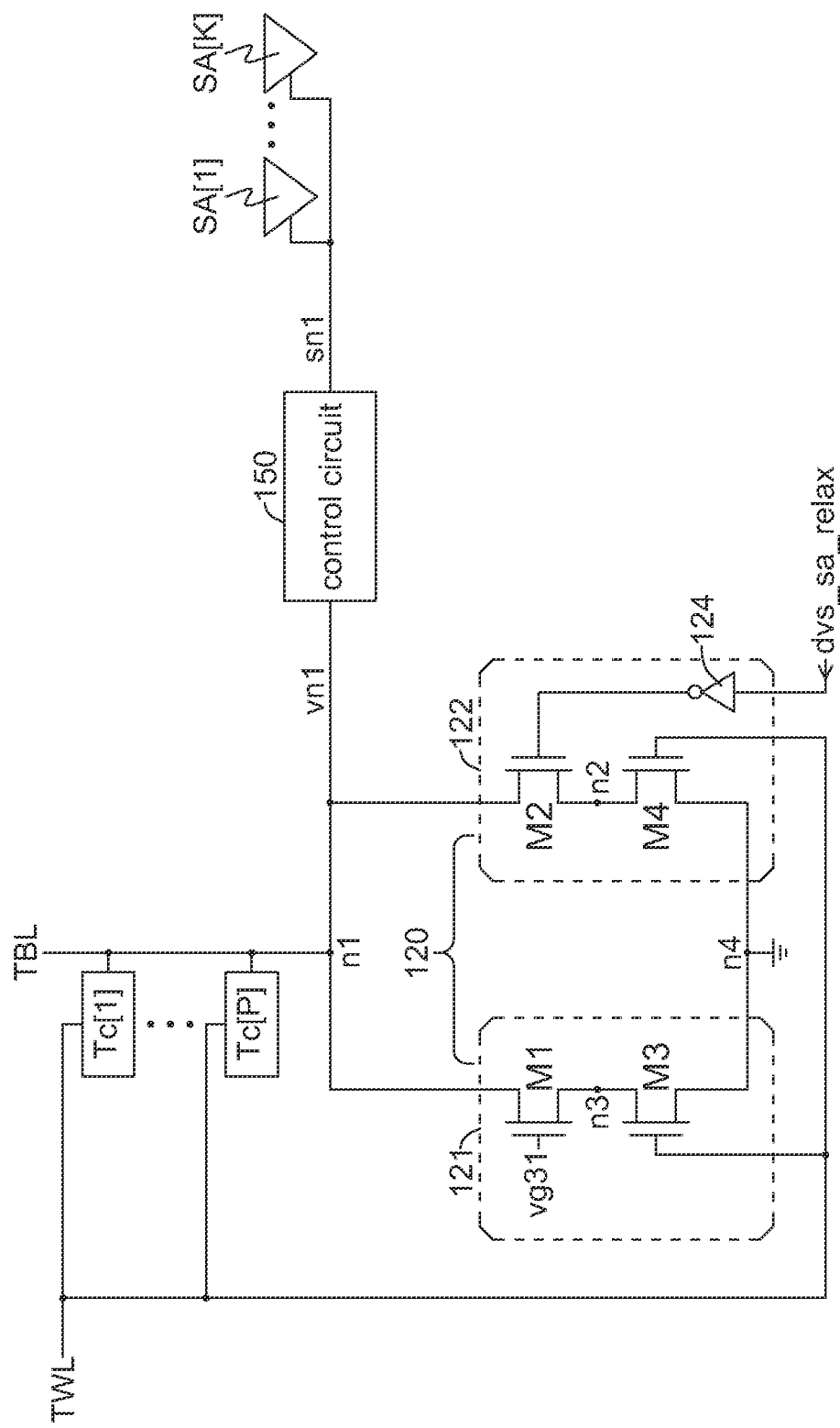
FIGS. 3a, 4a and 5a respectively illustrate embodiments of the auxiliary units shown in FIG. 1, wherein each auxiliary unit may include two auxiliary circuits.
Figure 3B:
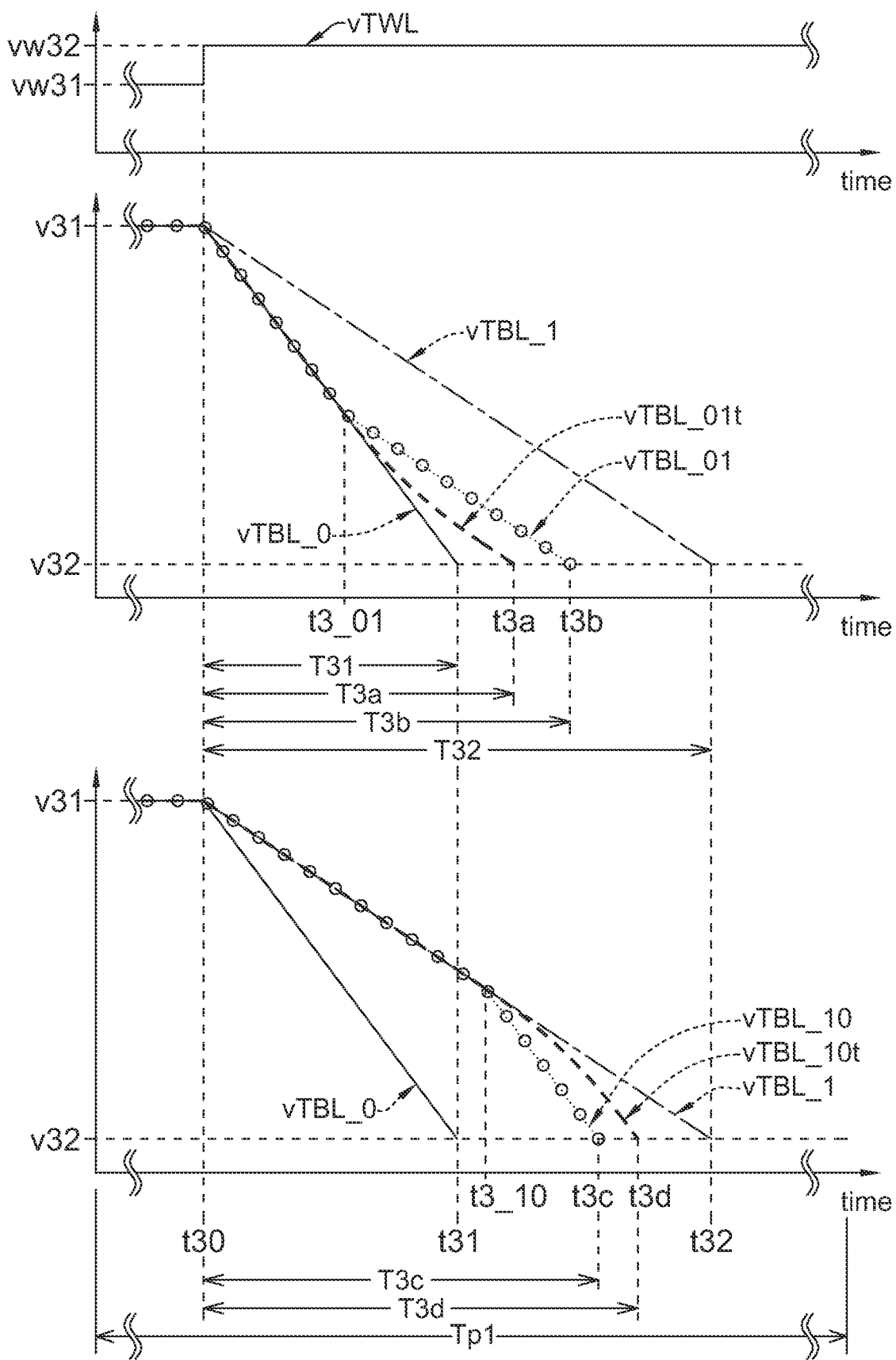

Following FIGS. 1 and 2, FIG. 3a illustrates the auxiliary unit 120 according to an embodiment of the invention, and FIG. 3b illustrates timing and waveform embodiment of signals related to operation of the auxiliary unit 120. As shown in FIG. 3a, the auxiliary unit 120 may include two auxiliary circuits 121 and 122 coupled to the tracking bit line TBL at a node n1, and a voltage at the node n1 of the tracking bit line TBL may be the signal vn1 to be received by the control signal 150. The auxiliary circuit 121 may include two transistors M1 and M3, and the auxiliary circuit 122 may include two transistors M2 and M4, and an inverter 124. For example, each of the transistors M1 to M4 may be an n-channel metal-oxide-semiconductor transistor.

In the auxiliary circuit 121, the transistor M1 may include a controlled terminal (e.g., a gate terminal) and two channel terminals (e.g., a drain terminal and a source terminal) respectively coupled to a signal vg31, the node n1 and another node n3. The transistor M3 may include a controlled terminal and two channel terminals respectively coupled to the tracking word line TWL, the node n3 and a different node n4 (e.g., a ground node).

In the auxiliary circuit 122, the transistor M2 may include a controlled terminal and two channel terminals; the two channel terminals may be respectively coupled to the node n1 and a node n2, and the controlled terminal may be coupled to the signal dvs_sa_relax via the inverter 124. The transistor M4 may include a controlled terminal and two channel terminals respectively coupled to the tracking word line TWL and the nodes n2 and n4.

As shown in FIG. 3b, during an operation cycle Tp1 (e.g., a read cycle which may last one period T of the clock CK, FIG. 2), a voltage of the tracking word line TWL may be driven from a voltage value vw31 to another voltage value vw32 at a time point t30, as shown by a waveform vTWL; when the tracking word line TWL is driven, the voltage of the tracking bit line TBL (i.e., the signal vn1) may start to change (e.g., to fall) from a voltage value v31. Time for the voltage of the tracking bit line TBL to change from the voltage value v31 to a different voltage value v32 may be considered as an operation parameter of the main circuit 110, and may be referred to as a tracking bit line discharge time hereinafter. The control circuit 150 may cause timing of the signal sn1 to reflect value (timespan) of the tracking bit line discharge time, and may therefore control timing of the sensing amplifiers SA[1] to SA[K], e.g., may control when to enable the sensing amplifiers SA[1] to SA[K].

Under different operation conditions, values of operation parameters of the main circuit 110 may vary. As previously described, the conventional circuit module is equipped with different mode-specific circuits respectively for different modes (different operation conditions); ideally, when one of the mode-specific circuits is on, the rest of the mode-specific circuits turn off, and values of operation parameters depend on the mode-specific circuit which is on. In reality, however, during switching of modes, on or off of each mode-specific circuit is uncertain and of random nature, and also suffers on-off transient; consequently, value range of each operation parameter under different modes becomes uncertain.

On the other hand, in the invention, though the value of the tracking bit line discharge time (the time for the voltage of the tracking bit line TBL to change from the voltage value v31 to the voltage value v32) relates to the auxiliary circuits 121 and 122 in the auxiliary unit 120, on and off of the auxiliary circuits 121 and 122 may not be mutually exclusive; when the auxiliary circuit 121 is on, the auxiliary circuit 122 may be on or off in response to which one of different levels (corresponding to different operation conditions/different modes) the signal dvs_sa_relax (FIGS. 1 and 2) is at. Hence, value range of the tracking bit line discharge time may no longer be uncertain. Operation of the two auxiliary circuits 121 and 122 may be described as follows.

Before the time point t30, because the tracking word line TWL is not driven, the transistors M3 and M4 may be off, the auxiliary circuits 121 and 122 may therefore be both off, and the voltage of the tracking bit line TBL may be the voltage value v31.

After the time point t30, as the tracking word line TWL is driven, the transistors M3 and M4 may be on, the signal vg31 may also cause the transistor M1 to be on. Since both the transistors M1 and M3 are on, the auxiliary circuit 121 may therefore be on, and may provide a conductive path between the nodes n1 and n4.

After the time point t30, when the auxiliary circuit 121 is on, if the signal dvs_sa_relax is at the level v0, the transistor M2 will be on. Since both the transistors M2 and M4 are on, the auxiliary circuit 122 may therefore be on, and may provide an additional conductive path between the nodes n1 and n4. Hence, after the time point t30, the tracking bit line TBL coupled to the node n1 may discharge to the node n4 via two shunt conductive paths jointly provided by the two auxiliary circuits 121 and 122, and may then change to the voltage value v32 at a time point t31, as shown by a waveform vTBL_0 in FIG. 3b. Accordingly, the tracking bit line discharge time may be a time value T31 (from the time points t30 to t31).

After the time point t30, when the auxiliary circuit 121 is on, if the signal dvs_sa_relax is at the level v1, the transistor M2 will be off, the auxiliary circuit 122 may therefore be off, and may not provide the additional conductive path between the nodes n1 and n4. Hence, after the time point t30, the tracking bit line TBL may discharge to the node n4 via a single conductive path solely provided by the auxiliary circuit 121, and may then change to the voltage value v32 at a time point t32, as shown by a waveform vTBL_1 in FIG. 3b. Accordingly, the tracking bit line discharge time may be a time value T32 (from the time points t30 to t32). As shown in FIG. 3b, the time value T32 may be greater (longer) than the time value T31.

After the time point t30, when the auxiliary circuit 121 is on, if the signal dvs_sa_relax changes from the level v0 to the level v1 at a time point t3_01 during the same operation cycle Tp1, the auxiliary circuit 122 may be on from the time points t30 to t3_01, and may turn off after the time point t3_01. Hence, after the time the point t30, the tracking bit line TBL may first discharge by a faster speed (because both auxiliary circuits 121 and 122 are on) between the time points t30 to t3_01, may then discharge by a slower speed (because the auxiliary circuit 122 is off) after the time point t3_01, and may eventually reach the voltage value v32 at a time point t3b, as shown by a waveform vTBL_01 in FIG. 3b. Accordingly, the tracking bit line discharge time may be a time value T3b (from the time points t30 to t3b).

After the time point t30, when the auxiliary circuit 121 is on and the signal dvs_sa_relax changes from the level v0 to the level v1 at the time point t3_01, it may be possible that the auxiliary circuit 122 needs a transient time to switch from on to off after the time point t3_01. Hence, after the time point t30, the tracking bit line TBL may first discharge by the faster speed between the time points t30 to t3_01, may then discharge by a decreasing speed (because the auxiliary circuit 122 gradually turns off from on) after the time point t3_01, and may eventually reach the voltage value v32 at a time point t3a, as shown by a waveform vTBL_01t in FIG. 3b. Accordingly, the tracking bit line discharge time may be a time value T3a (from the time points t30 to t3a).

After the time point t30, when the auxiliary circuit 121 is on, if the signal dvs_sa_relax changes from the level v1 to the level v0 at a time point t3_10 during the same operation cycle Tp1, the auxiliary circuit 122 may be off from the time points t30 to t3_10, and may turn on after the time point t3_10. Hence, after the time the point t30, the tracking bit line TBL may first discharge by the slower speed (because the auxiliary circuit 122 is off) between the time points t30 to t3_10, may then discharge by the faster speed (because both auxiliary circuits 121 and 122 are on) after the time point t3_10, and may eventually reach the voltage value v32 at a time point t3c, as shown by a waveform vTBL_10 in FIG. 3b. Accordingly, the tracking bit line discharge time may be a time value T3c (from the time points t30 to t3c).

After the time point t30, when the auxiliary circuit 121 is on and the signal dvs_sa_relax changes from the level v1 to the level v0 at the time point t3_10, it may be possible that the auxiliary circuit 122 needs a transient time to switch from off to on after the time point t3_10. Hence, after the time the point t30, the tracking bit line TBL may first discharge by the slower speed between the time points t30 to t3_10, may then discharge by an increasing speed (because the auxiliary circuit 122 gradually turns on) after the time point t3_10, and may eventually reach the voltage value v32 at a time point t3d, as shown by a waveform vTBL_10t in FIG. 3b. Accordingly, the tracking bit line discharge time may be a time value T3d (from the time points t30 to t3d).

From FIG. 3b, it is understood that, during the same operation cycle Tp1, regardless of whether the signal dvs_sa_relax is at the level v0, is at the level v1, switches from the levels v0 to v1 or switches from the levels v1 to v0 (i.e., whether the operation condition/mode keeps the same or changes), the auxiliary circuit 121 will be on (after the tracking word line TWL is driven), and the auxiliary circuit 122 will be on or off in response to whether the signal dvs_sa_relax is at the level v0 or v1, such that the voltage waveform of the tracking bit line TBL will certainly be enveloped between the waveforms vTBL_0 and vTBL_1, and the tracking bit line discharge time will certainly be in a range between the time values T31 and T32. Accordingly, when operation condition/mode changes, the invention may prevent difficulty to reliably determine value ranges of operation parameters caused by uncertainty of mode-switching and on-off transient of the conventional circuit module. In the invention, by configuring an operation margin of the main circuit 110 to cover a range between the time values T31 and T32 (e.g., by configuring read timing of the sensing amplifiers SA[1] to SA[K] to tolerate a timing variation between the time values T31 and T32), then, regardless of whether the signal dvs_sa_relax switches between different levels (whether operation condition/mode changes) within the same operation cycle Tp1, the main circuit 110 may maintain currently on-going normal operation (e.g., read) during the operation cycle Tp1 without interruption and suspension, and may also ensure operation correctness (e.g., correctness of read data) of the operation cycle Tp1.

Figure 4A:
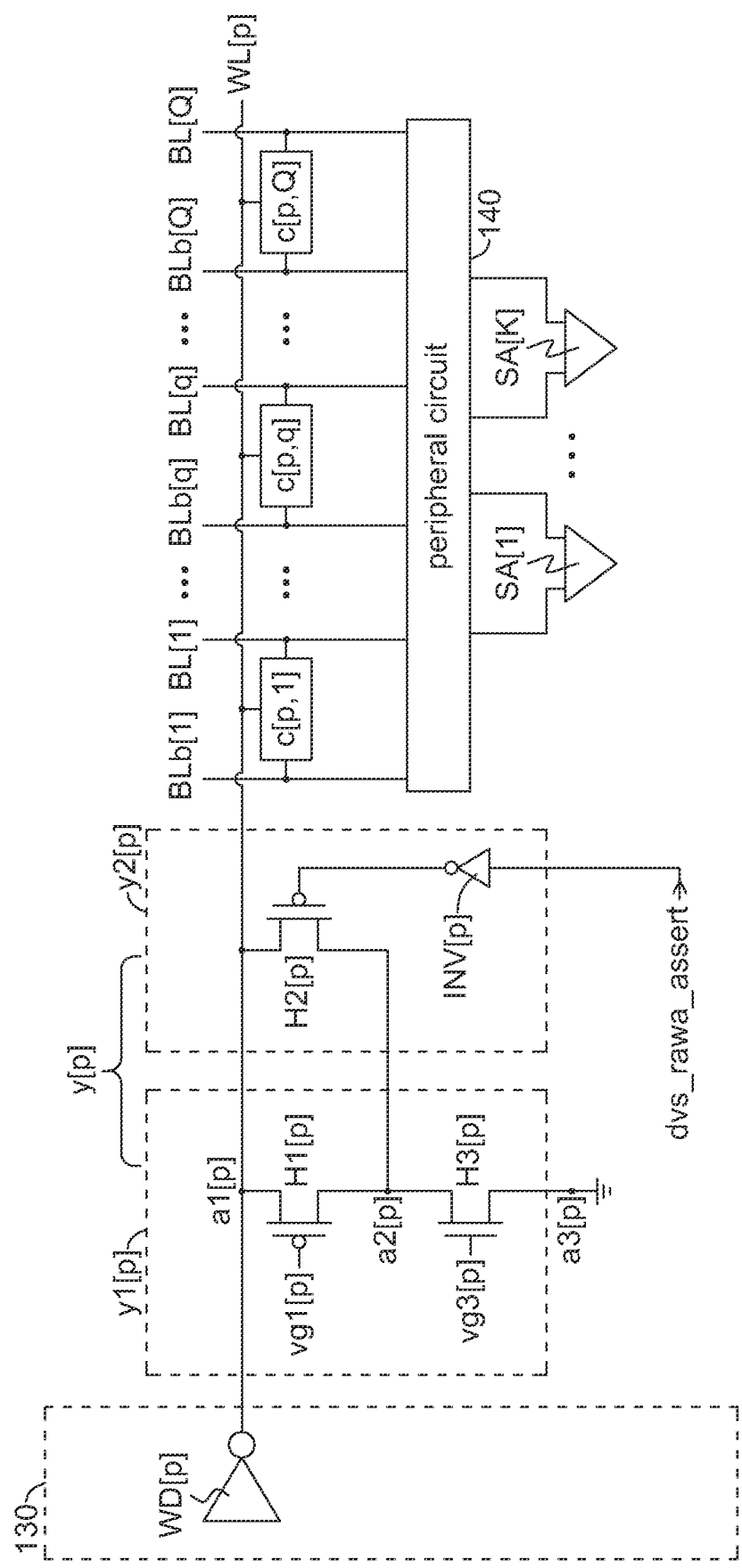
Figure 4B:
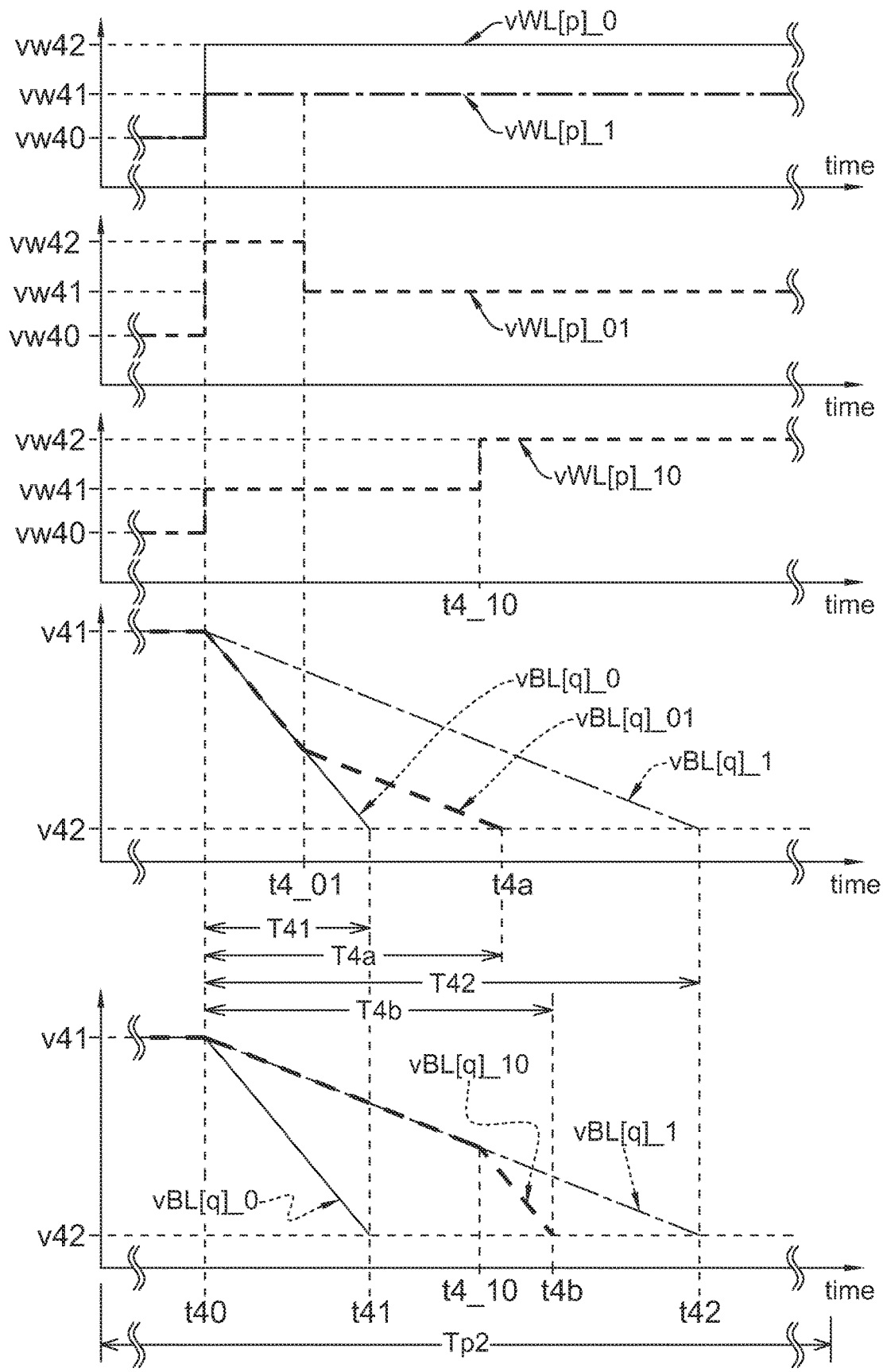

Following FIGS. 1 and 2, FIG. 4a illustrates the auxiliary unit y[p] (one of the auxiliary units y[1] to y[P], FIG. 1) according to an embodiment of the invention, and FIG. 4b illustrates timing and waveform embodiment of signals related to operation of the auxiliary unit y[p]. As shown in FIG. 4a, the auxiliary unit y[1] may include two auxiliary circuits y1[p] and y2[p] coupled to the corresponding word line WL[p] at a node a1[p]. The word line WL[p] may also be coupled to a word line driver WD[p] (e.g., an inverter) in the peripheral circuit 130. The auxiliary circuit y1[p] may include two transistors H1[p] and H3[p], and the auxiliary circuit y2[p] may include a transistor H2[p] and an inverter INV[p]. For example, the transistors H1[p] and H2[p] may be p-channel metal-oxide-semiconductor transistors, and the transistor H3[p] may be an n-channel metal-oxide-semiconductor transistor.

In the auxiliary circuit y1[p], the transistor H1[p] may include a controlled terminal and two channel terminals respectively coupled to a signal vg1[p], the node a1[p] and another node a2[p]; in an embodiment, the signal vg1[p] may cause the transistor H1[p] to be on. The transistor H3[p] may include a controlled terminal and two channel terminals respectively coupled to a signal vg3[p], the node a2[p] and another node a3[p] (e.g., a ground node).

In the auxiliary circuit y2[p], the transistor H2[p] may include a controlled terminal and two channel terminals; the two channel terminals may be coupled to the nodes a1[p] and a2[p] respectively, and the controlled terminal may be coupled to the signal dvs_rawa_assert via the inverter INV [p]. When the signal dvs_rawa_assert is of the level v0, the transistor H2[p] may be off, and therefore the auxiliary circuit y2[p] may be off. When the signal dvs_rawa_assert is of the level v1, the transistor H2[p] may be on, and thus the auxiliary circuit y2[p] may be on.

As shown in FIG. 4b, during an operation cycle Tp2 (e.g., a read cycle which may last one period T of the clock CK, FIG. 2), when reading the memory cell c[p,q] coupled to the word line WL[p], the word line WL[p] may be driven at a time point t40; accordingly, a voltage of the bit line BL[q] or BLb[q] may start to change (e.g., to decrease) from a voltage value v41; for convenience of discussion hereinafter, it is assumed that the voltage of the bit line BL[q] is the one which starts to change. Time for the voltage of the bit line BL[q] to change from the voltage value v41 to another voltage value v42 may be considered as an operation parameter of the main circuit 110, and may be referred to as bit line discharge time hereinafter.

When the word line WL[p] is driven at the time point t40, if the signal dvs_rawa_assert is at the level v0, the word line WL[p] may be driven from a voltage value vw40 to another voltage value vw42, as shown by a waveform vWL[p]_0; correspondingly, the voltage of the bit line BL[q] may start to change (e.g., fall) from the voltage value v41 at the time point t40, and may change to the voltage value v42 at a time point v41, as shown by a waveform vBL[q]_0. Hence, the bit line discharge time may be a time value T41 (from the time points t40 to t41).

When the word line WL[p] is driven at the time point t40, if the signal dvs_rawa_assert is at the level v1, the word line WL[p] may be driven from the voltage value vw40 to another voltage value vw41, as shown by a waveform vWL[p]_1; correspondingly, the voltage of the bit line BL[q] may change to the voltage v42 at a time point v42, as shown by a waveform vBL[q]_1. Hence, the bit line discharge time may be a time value T42 (from the time points t40 to t42).

The voltage values vw41 and vw42 may be different, so the voltage of the word line WL[p] may adapt different operation conditions when reading; for example, the voltage value vw42 may be greater (higher) than the voltage value vw41. When the word line WL[p] is driven at the time point t40, regardless of whether the signal dvs_rawa_assert is at the level v0 or v1, the signals vg1[p] and vg3[p] (FIG. 4a) may cause the transistors H1[p] and H3[p] to be on, and may therefor cause the auxiliary circuit y1[p] to be on.

When the word line WL[p] is driven at the time point t40, if the signal dvs_rawa_assert is at the level v0, the transistor H2[p] may be off, therefore the auxiliary circuit y2[p] may be off, and the auxiliary circuit y1[p] which is on may cause the voltage of the word line WL[p] to be the higher voltage value vw42; on the other hand, if the signal dvs_rawa_assert is at the level v1, the transistor H2[p] may be on, therefore the auxiliary circuit y2[p] may be on, and the auxiliary circuits y1[p] and y2[p] which are both on may jointly cause the voltage of the word line WL[p] to be the lower voltage value vw41. When the word line WL[p] is driven to the higher voltage value vw42 (as shown by the waveform vWL[p]_0), the voltage of the bit line BL[q] may change (e.g., discharge) by a fast speed (as shown by the waveform VBL[q]_0); when the word line WL[p] is driven to the lower voltage value vw41 (as shown by the waveform vWL[p]_1), the voltage of the bit line BL[q] may change by a slower speed (as shown by the waveform VBL[q]_1).

In an embodiment, the voltage value vw42 may be lower than the supply value vdd1 (FIG. 2) to implement read assistant by word line underdrive when the supply voltage VDD is the supply value vdd1. In an embodiment, the voltage value vw41 may substantially equal the supply value vdd2 (FIG. 2) to stop read assistant by word line underdrive when the supply voltage VDD is the supply value vdd2.

As shown in FIG. 4b, after the word line WL[p] is driven at the time point t40, if the signal dvs_rawa_assert switches from the level v0 to the level v1 at a time point t4_01, the word line WL[p] may first be driven to the voltage value vw42 (since the auxiliary circuits y1[p] and y2[p] are respectively on and off) between the time points t40 and t4_01, and may then be driven to the voltage value vw41 (since the auxiliary circuits y1[p] and y2[p] are both on) after the time point t4_01, as shown by a waveform vWL[p]_01; correspondingly, after the time point t40, the voltage of the bit line BL[q] may first change by the faster speed during the time points t40 to t4_01, may then change by the slower speed after the time point t4_01, and may reach the voltage value v42 later at a time point t4a, as shown by a waveform vBL[q]_01. Hence, the bit line discharge time may be a time value T4a (from the time points t40 to t4a).

After the word line WL[p] is driven at the time point t40, if the signal dvs_rawa_assert switches from the level v1 to the level v0 at a time point t4_10, the word line WL[p] may first be driven to the voltage value vw41 (since the auxiliary circuits y1[p] and y2[p] are both on) between the time points t40 and t4_10, and may then be driven to the voltage value vw42 (since the auxiliary circuits y1[p] and y2[p] are respectively on and off) after the time point t4_10, as shown by a waveform vWL[p]_10; correspondingly, after the time point t40, the voltage of the bit line BL[q] may first change by the slower speed during the time points t40 to t4_10, may then change by the faster speed after the time point t4_10, and may reach the voltage value v42 later at a time point t4b, as shown by a waveform vBL[q]_10. Hence, the bit line discharge time may be a time value T4b (from the time pints t40 to t4b).

From FIG. 4b, it is understood that the bit line discharge time (e.g., the time value T4a or T4b) will be between the time values T41 and T42 even if the signal dvs_rawa_assert switches between different levels (corresponding to different operation conditions/modes) withing the same operation cycle Tp2. Furthermore, though not depicted in FIG. 4b, the bit line discharge time will still fall between the time values T41 and T42 even if the auxiliary circuit y2[p] suffers transient when the auxiliary circuit y2[p] switches between on and off during the same operation cycle Tp2 as the signal dvs_rawa_assert switches between different levels. Therefore, in the invention, by configuring an operation margin of the main circuit 110 to cover a range between the time values T41 and T42 (e.g., by configuring read timing of the sensing amplifiers SA[1] to SA[K] to tolerate a timing variation between the time values T41 and T42), then, regardless of whether the signal dvs_rawa_assert switches between different levels (whether operation condition/mode changes) within the same operation cycle Tp2, the main circuit 110 may maintain normal operation (e.g., read) during the operation cycle Tp2 without interruption and suspension, and may also ensure operation correctness (e.g., correctness of read data) of the operation cycle Tp2.

Figure 5A:
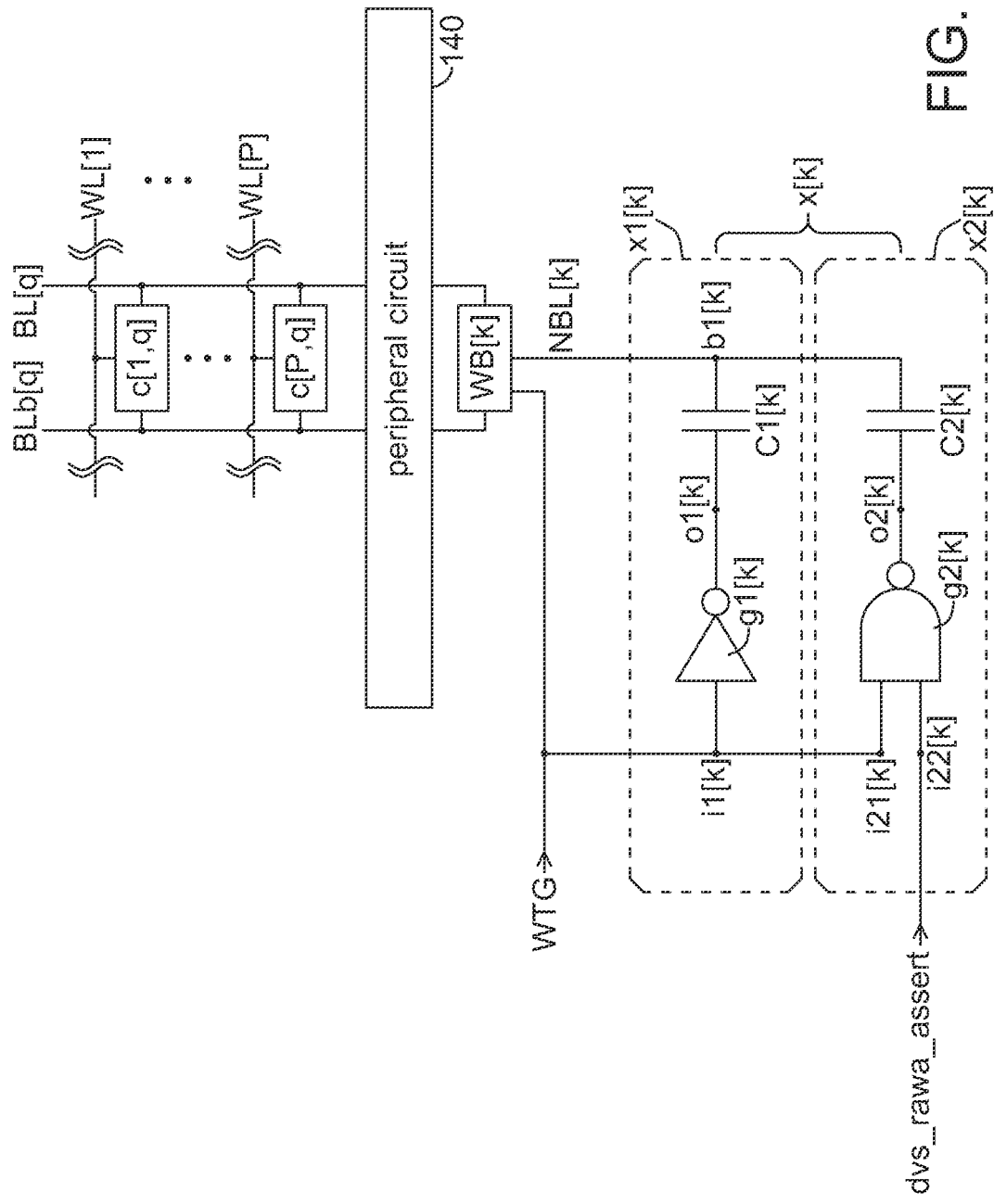
Figure 5B:
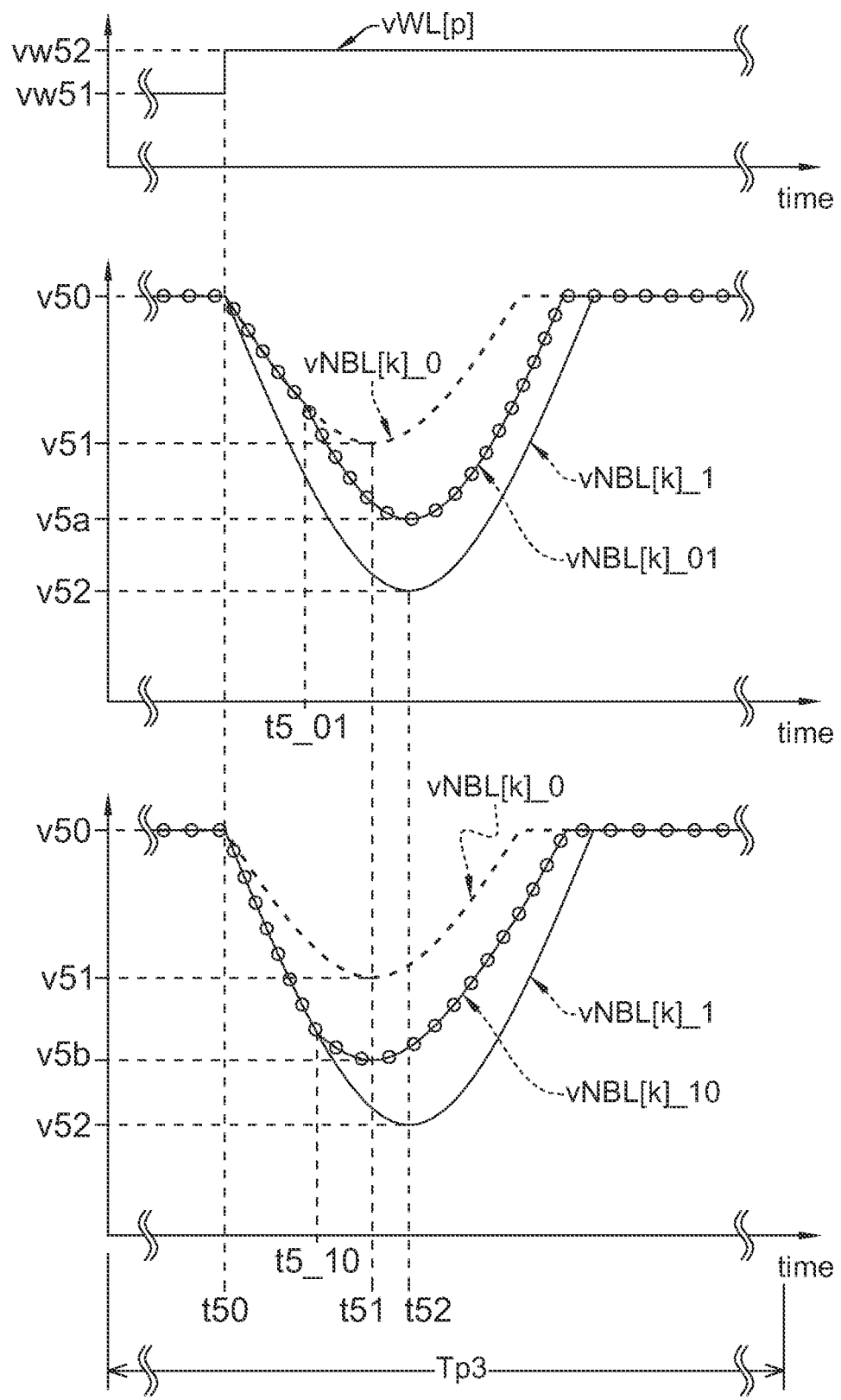

Following FIGS. 1 and 2, FIG. 5a illustrates the auxiliary unit x[k] (one of the auxiliary units x[1] to x[K], FIG. 1) according to an embodiment of the invention, and FIG. 5b illustrates timing and waveform embodiment of signals related to operation of the auxiliary unit x[k]. As shown in FIG. 5a, the auxiliary unit x[k] may include two auxiliary circuits x1[k] and x2[k] coupled to a negative voltage bit line NBL[k] at a node b1[k]. The node b1[k] may be coupled to the write circuit WB[k] via the negative voltage bit line NBL[k]. The auxiliary circuit x1[k] may include a logic gate g1[k] and a capacitor C1[k], and the auxiliary circuit x2[k] may include a logic gate g2[k] and a capacitor C2[k]. The logic gate g1[k] may be an inverter, and may include an input terminal i1[k] and an output terminal o1[k]; the capacitor C1[k] may be coupled between the output terminal o1[k] and the node b1[k]. The logic gate g2[k] may be a NAND gate, and may include two input terminals i21[k] and i22[k] and an output terminal o2[k]; the two input terminals i21[k] and i22[k] may be coupled to the input terminal i1[k] and the signal dvs_rawa_assert respectively, and the capacitor C2[k] may be coupled between the output terminal o2[k] and the node b1[k]. As shown in FIG. 5a, the signal WTG may be coupled to the auxiliary circuits x1[k] and x2[k] via the input terminals i1[k] and i21[k], and the signal dvs_rawa_assert may be coupled to the auxiliary circuit x2[k] via the input terminal i22[k].

As shown in FIG. 5b, during an operation cycle Tp3 (e.g., a write cycle which may last one period T of the clock CK, FIG. 2), when writing the memory cell c[p,q] coupled to the word line WL[p], the peripheral circuit 140 may relay the corresponding bit lines BL[q] and BLb[q] to the write circuit WB[k], the word line WL[p] may be driven from a voltage vw51 to another voltage value vw52 at a time point t50 as shown by a waveform vWL[p]; the signal WTG (FIG. 5) may trigger the write circuit WB[k] to write data, and hence a voltage of the negative voltage bit line NBL[k] may start to change (e.g., to decrease) from a voltage value v50 (e.g., a ground voltage value) to a voltage extremum, and may then reversely change (e.g., to increase) back to the voltage value v50, so a voltage waveform of the negative voltage bit line NBL[k] may show a downward pulse. The voltage extremum of the negative voltage bit line NBL[k] may be considered as an operation parameter of the main circuit 110, and may be referred to as a bit line negative voltage value hereinafter. The voltage waveform of the negative voltage bit line NBL[k] may be applied to the bit lines BL[q] and BLb[q] via the write circuit WB[k] and the peripheral circuit 140, so as to implement write assistant.

As shown in FIG. 5b, after the time point t50, if the signal dvs_rawa_assert is at the level v1, the auxiliary circuits x1[k] and x2[k] may both be on, and may jointly cause the voltage of the negative voltage bit line NBL[k] to vary as a waveform vNBL[k]_1 when the signal WTG triggers; since the waveform vNBL[k]_1 reaches a voltage extremum (equal to a voltage value v52) at a time point t52, the bit line negative voltage may be the voltage value v52.

After the time point t50, if the signal dvs_rawa_assert is at the level v0, the auxiliary circuit x2[k] may be off, and the auxiliary circuit x1[k] may solely be on. Hence, when the signal WTG triggers, the auxiliary circuit x1[k] alone may cause the voltage of the negative voltage bit line NBL[k] to vary as a waveform vNBL[k]_0; since the waveform vNBL [k]_0 reaches a voltage extremum (equal to a voltage value v51) at a time point t51, the bit line negative voltage may be the voltage value v51.

After the time point t50, if the signal dvs_rawa_assert switches from the level v0 to the level v1 at a time point t5_01 during the same operation cycle Tp3, the auxiliary circuit x2[k] may switch from off to on when the auxiliary circuit x1[k] remains on. Hence, when the signal WTG triggers, the voltage of the negative voltage bit line NBL[k] may vary as a waveform vNBL[k]_01 which reaches a voltage extremum equal to a voltage value v5a, so the bit line negative voltage may be the voltage value v5a.

After the time point t50, if the signal dvs_rawa_assert switches from the level v1 to the level v0 at a time point t5_10 during the same operation cycle Tp3, the auxiliary circuit x2[k] may switch from on to off when the auxiliary circuit x1[k] remains on. Hence, when the signal WTG triggers, the voltage of the negative voltage bit line NBL[k] may vary as a waveform vNBL[k]_10 which reaches a voltage extremum equal to a voltage value v5b, so the bit line negative voltage may be the voltage value v5b.

From FIG. 5b, it is understood that the bit line negative voltage (e.g., the voltage value v5a or v5b) will be between the voltage values v51 and v52 even if the signal dvs_rawa_assert switches between different levels (corresponding to different operation conditions/modes) withing the same operation cycle Tp3. Furthermore, though not depicted in FIG. 5b, the bit line negative voltage will still fall between the voltage values v51 and v52 even if the auxiliary circuit x2[k] suffers transient when the auxiliary circuit x2[k] switches between on and off during the same operation cycle Tp3 as the signal dvs_rawa_assert switches between different levels. Therefore, in the invention, by configuring an operation margin of the main circuit 110 to cover a range between the voltage values v51 and v52 (e.g., by configuring the bit lines BL[q] and BLb[q] to tolerate a negative voltage variation between the voltage values v51 and v52), then, regardless of whether the signal dvs_rawa_assert switches between different levels (whether operation condition/mode changes) within the same operation cycle Tp3, the main circuit 110 may maintain normal operation (e.g., write) during the operation cycle Tp3 without interruption and suspension, and may also ensure operation correctness (e.g., correctness of write data) of the operation cycle Tp3.

To sum up, prior art adopts different mode-specific circuits for different modes; when switching between the modes, one mode-specific circuit switches from off to on, and another mode-specific circuit switches from on to off. Because of uncertainty during mode-switching and on-off transient of the mode-specific circuits, the prior art suffers difficulty to reliably determine value ranges of related operation parameters and related margins, and consequently fails to maintain normal operation when switching between modes. On the other hand, in the invention, each auxiliary unit may include two auxiliary circuits; when related control signal switches between different levels (corresponding to different operation conditions/modes), only one of the two auxiliary circuits may follow to switch between on and off, while the other one of the two auxiliary circuits may be on regardless of which level the control signal is at. Accordingly, the invention may certainly and reliably determine value ranges of related operation parameters and related margins, and therefore may maintain normal operation of an operation cycle even if the operation condition/mode changes during the same operation cycle.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A circuit with reliable margin configuration, comprising:
   a main circuit comprising a first node;
   a first auxiliary circuit coupled to the first node; and
   a second auxiliary circuit coupled to the first node and a control signal;
   wherein:
      when the first auxiliary circuit is on, the second auxiliary circuit is on or off according to whether the control signal is of a first level or a second level;
      when the first auxiliary circuit and the second auxiliary circuit are both on, the first auxiliary circuit and the second auxiliary circuit jointly cause an operation parameter of the main circuit to be a first value;
      when the first auxiliary circuit is on and the second auxiliary circuit is off, the first auxiliary circuit causes said operation parameter to be a second value different from the first value; and
      an operation margin of the main circuit covers a range between the first value and the second value.

2. The circuit module of claim 1, wherein:
   when a supply voltage of the main circuit is a first supply value and a period of a clock on which the main circuit operates is a first period value, the control signal is of the first level;
   when the supply voltage of the main circuit is a second supply value and the period of said clock is a second period value, the control signal is of the second level; and
   the first supply value and the second supply value are different, and the first period value and the second period value are different.

3. The circuit module of claim 1, wherein the main circuit comprises:
   at least a memory cell coupled to a word line and a bit line;
   at least a tracking cell coupled to a tracking word line and a tracking bit line, and the first node being coupled to the tracking bit line; and
   a sensing amplifier coupled to the bit line.

4. The circuit module of claim 3, wherein
   the first auxiliary circuit comprises:
   a first transistor comprising a first controlled terminal and two first channel terminals; the two first channel terminals being coupled to the first node and a third node respectively; and
   a third transistor comprising a third controlled terminal and two third channel terminals; the two third channel terminals being coupled to the third node and a fourth node respectively, one of the first controlled terminal and the third controlled terminal being coupled to the tracking word line; and
   the second auxiliary circuit comprises:
   a second transistor comprising a second controlled terminal and two second channel terminals; the two second channel terminals being coupled to the first node and a second node respectively; and
   a fourth transistor comprising a fourth controlled terminal and two fourth channel terminals; the two fourth channel terminals being coupled to the second node and the fourth node respectively, one of the second controlled terminal and the fourth controlled terminal being coupled to the control signal, and the other one of the second controlled terminal and the fourth controlled terminal being coupled to the tracking word line.

5. The circuit module of claim 3, wherein said operation parameter is time for a voltage of the tracking bit line to change to a second voltage value after the tracking word line is driven.

6. The circuit module of claim 3, wherein said operation parameter is time for a voltage of the tracking bit line to change from a first voltage value to a second voltage value.

7. The circuit module of claim 3, wherein said operation margin is a timing margin of the sensing amplifier.

8. The circuit module of claim 1, wherein the main circuit comprises:
   at least a memory cell coupled to a word line and a bit line, and the first node being coupled to the word line; and
   a sensing amplifier coupled to the bit line.

9. The circuit module of claim 8, wherein
   the first auxiliary circuit comprises:
   a first transistor comprising two first channel terminals coupled to the first node and a second node respectively; and
   a third transistor comprising two third channel terminals coupled to the second node and a third node respectively; and
   the second auxiliary circuit comprises:
   a second transistor comprising a second controlled terminal and two second channel terminals coupled to the control signal, the first node and the second node respectively.

10. The circuit module of claim 8, wherein said operation parameter is time for a voltage of the bit line to change from a third voltage value to a fourth voltage value.

11. The circuit module of claim 8, wherein said operation parameter is time for a voltage of the bit line to change to a fourth voltage vale after the word line is driven.

12. The circuit module of claim 8, wherein: after the word line is driven, if the control signal is of the first level, a voltage of the word line is a fifth voltage value; if the control signal is of the second level, the voltage of the word line is a sixth voltage value different from the fifth voltage value.

13. The circuit module of claim 8, wherein said operation margin is a timing margin of the sensing amplifier.

14. The circuit module of claim 1, wherein the main circuit comprises:
   at least a memory cell coupled to a word line and a bit line;
   a write circuit coupled to the bit line and a negative voltage bit line, and the first node being coupled to the negative voltage bit line.

15. The circuit module of claim 14, wherein
   the first auxiliary circuit comprises:
   a first logic gate comprising a first input terminal and a first output terminal; and
   a first capacitor coupled between the first output terminal and the first node; and
   the second auxiliary circuit comprises:
   a second logic gate comprising two second input terminals and a second output terminal, the two second input terminals being coupled to the first input terminal and the control signal respectively; and
   a second capacitor coupled between the second output terminal and the first node.

16. The circuit module of claim 15, wherein the first logic gate is an inverter, and the second logic gate is a NAND gate.

17. The circuit module of claim 14, wherein said operation parameter is a voltage extremum of the negative voltage bit line after the word line is driven.

18. The circuit module of claim 14, wherein said operation margin is a negative voltage margin of the bit line.

19. The circuit module of claim 1 further comprising:
a third auxiliary circuit coupled to a fourth node;
a fourth auxiliary circuit coupled to the fourth node and a second control signal; wherein:
when the third auxiliary circuit is on, the fourth auxiliary circuit is on or off according to whether the second control signal is of a third level or a fourth level;
when the third auxiliary circuit and the fourth auxiliary circuit are both on, the third auxiliary circuit and the fourth auxiliary circuit jointly cause a second operation parameter of the main circuit to be a third value;
when the third auxiliary circuit is on and the fourth auxiliary circuit is off, the third auxiliary circuit causes said second operation parameter to be a fourth value different from the third value;
a second operation margin of the main circuit covers a range between the third value and the fourth value; and
the control signal and the second control signal do not concurrently switch between different levels.

20. The circuit module of claim 19, wherein:
when the control signal switches between different levels, the second control signal switches between different levels after a first delay time; and
when the second control signal switches between different levels again, the control signal switches between different levels again after a second delay time.

* * * * *